(12) United States Patent
Cunningham et al.

(10) Patent No.: US 7,826,724 B2
(45) Date of Patent: Nov. 2, 2010

(54) ELECTRONIC SUBSTRATE NON-CONTACT HEATING SYSTEM AND METHOD

(75) Inventors: Stephen Michael Cunningham, San Marcos, CA (US); Brett Huey, Carlsbad, CA (US)

(73) Assignee: Nordson Corporation, Westlake, OH (US)

( * ) Notice: Subject to any disclaimer, the term of this patent is extended or adjusted under 35 U.S.C. 154(b) by 674 days.

(21) Appl. No.: 11/739,364

(22) Filed: Apr. 24, 2007

(65) Prior Publication Data

US 2007/0246192 A1 Oct. 25, 2007

Related U.S. Application Data

(60) Provisional application No. 60/794,399, filed on Apr. 24, 2006.

(51) Int. Cl.
  *A61H 33/08* (2006.01)
  *C23C 16/00* (2006.01)
(52) U.S. Cl. ........................ 392/379; 118/725
(58) Field of Classification Search ......... 392/360–479; 118/724, 725, 726; 165/96
  See application file for complete search history.

(56) References Cited

U.S. PATENT DOCUMENTS

| | | | |
|---|---|---|---|
| 6,123,775 A * | 9/2000 | Hao et al. ................. 118/724 |
| 6,223,447 B1 * | 5/2001 | Yudovsky et al. ............... 34/58 |
| 6,506,291 B2 * | 1/2003 | Tsai et al. ............... 204/298.15 |
| 6,665,492 B1 * | 12/2003 | Garcia et al. ................. 392/383 |
| 6,669,783 B2 * | 12/2003 | Sexton et al. ................ 118/728 |
| 6,861,278 B2 | 3/2005 | Quinones et al. |
| 2003/0194833 A1 | 10/2003 | Quinones et al. |
| 2005/0161846 A1 | 7/2005 | Quinones et al. |

\* cited by examiner

*Primary Examiner*—Daniel Robinson
(74) *Attorney, Agent, or Firm*—Wood, Herron & Evans, LLP

(57) ABSTRACT

System and method for the non-contact heating of an electronic substrate using inline heating elements in combination with an automatically controlled airflow. Air heated by the elements is communicated to one or more plenums, which discharge the heated air towards an impingement plate. The impingement plate includes a plurality of openings through which heated air from the plenum passes on its way to heat the electronic substrate. The automatic control of the airflow may be prompted by an operating condition, such as a sensed airflow and/or a transition into an equipment operating mode, e.g., a warm-up, standby, halt production and cool down state. Production may be automatically optimized by using a profile to conjunctively control both the heating of the air and the directing the flow of the heated air. Such a profile accounts for a combined affect of both heating the air and directing the flow of the heated air.

21 Claims, 5 Drawing Sheets

ELECTRONIC SUBSTRATE NON-CONTACT HEATING SYSTEM AND METHOD

CROSS-REFERENCE TO RELATED APPLICATION

This application claims the benefit U.S. Provisional Application No. 60/794,399, filed on Apr. 24, 2006, which application is hereby incorporated by reference herein in its entirety.

FIELD OF THE INVENTION

This invention relates generally to liquid dispensing machinery and methods used in semiconductor package manufacturing.

BACKGROUND OF THE INVENTION

In the microelectronics industry, a die carrying an integrated circuit is commonly mounted on a package carrier, such as a substrate, a circuit board or a leadframe, that provides electrical connections from the die to the exterior of the package. In one such packaging arrangement called flip chip mounting, the die includes an area array of electrically conductive contacts, known as bond pads, that are electrically connected to corresponding area array of electrically-conductive contacts on the package carrier, known as solder balls or bumps. Typically, the solder bumps are registered with the bond pads and a reflow process is applied to create electrical connections in the form of solder joints between the die and the package carrier. The process of flip chip mounting results in a space or gap between the die and the package carrier.

The die and the package carrier are usually formed of different materials having mismatched coefficients of thermal expansion. As a result, the die and the package carrier experience significantly different dimension changes when heated that creates significant thermally-induced stresses in the electrical connections between the die and the package carrier. If uncompensated, the disparity in thermal expansion can result in degradation in the performance of the die, damage to the solder joints, or package failure. As the size of the die increases, the effect of a mismatch in the coefficient of thermal expansion between the die and the substrate becomes more pronounced. In stacked die packages, the mismatch in the coefficients of thermal expansion between the die laminate and the package may be even greater than in single die packages. The failure mechanism in stacked die packages may shift from solder joint damage to die damage.

To improve the reliability of the electrical connections in flip chip package assemblies, it is common in the microelectronics industry to fill the gap between the die and the package carrier with an encapsulant material. Underfilling with encapsulant material increases the fatigue life of the package and improves the reliability of the electrical connections by reducing the stress experienced by the electrical connections during thermal cycling or when the die and the package carrier have a significant temperature differential. The encapsulant material also isolates the electrical connections from exposure to the ambient environment by hermetically sealing the gap and lends mechanical strength to the package assembly for resisting mechanical shock and bending. The encapsulant material further provides a conductive path that removes heat from the die and that operates to reduce any temperature differential between the die and substrate. As a result, underfilling with encapsulant material significantly increases the lifetime of the assembled package.

Various conventional underfilling methods are used to introduce the encapsulant material into the gap between the die and the substrate. One conventional method relies on surface tension wetting or capillary action to induce movement of a low-viscosity encapsulant material with strong wetting characteristics from a side edge into the gap. According to this method, encapsulant material is dispensed along side edges of the die, and capillary forces operate to attract the encapsulant material into the gap. Typically, the viscosity of the encapsulant material is reduced and the flow rate increased by pre-heating the substrate in the vicinity of the die before the encapsulant material is dispensed onto the substrate. Put another way, the heat assists encapsulant adhesive to flow out more freely and wick into small cavities on the substrate. The underfill material is subsequently cured after the electrical connections have been fully encapsulated.

To this end, many conventional techniques involve positioning the substrate onto a heated block surface. This method of heating by contact, however, is effective only where the substrate surface is flat, e.g., has not been populated with mounted components. In all other cases, it is necessary to use a non-contact heating method, such as by blowing heated air onto the substrate. More particularly, a typical non-contact, or air impingement system includes a heated aluminum block. The top surface of the block, upon which the substrate rests, has formed apertures that allow for the through passage of air to the substrate. Resistance heating elements contained within the block heat the air as it is blown from an air plenum positioned below the heated block to the substrate.

While generally effective in facilitating encapsulant flow, the heavy aluminum construction of such conventional blocks imputes a high thermal mass, resulting in relatively slow warm-up and cool down times. The heavy construction of the blocks often makes them cumbersome to position and complicates accommodating any special unusual or customized product requirements.

Moreover, the mechanisms responsible for providing the airflow through the block can limit the efficiency of an underfilling operation. A conventional non-contact system incorporates a manually adjustable flow valve to control the airflow through the plenum/block towards the substrate. This valve is often incorrectly set by an operator, resulting in improperly heated substrates. Also, air is typically pumped continuously regardless of whether a part is actually in position. This can result in wasted thermal energy and higher rates of consumption of air and electricity, in addition to faulty production.

There consequently exists a need for an improved underfilling system and associated process.

SUMMARY OF THE INVENTION

Embodiments of the present invention overcome these and other problems of conventional underfilling systems and methods by providing an improved apparatus and associated method for non-contact heating of a surface of an electronic substrate. In one aspect of the invention, an apparatus includes a heating element having an inlet for unheated air, a heater for heating the air, and an outlet for the heated air. A plenum includes an inlet for receiving the heated air from the outlet of the heating element. The plenum also includes an opening for the discharge of the heated air. An impingement plate is mounted over the opening of the plenum. The impingement plate includes a plurality of openings through which heated air from the plenum passes. A support positions the electronic substrate adjacent the impingement plate so that the heated air which passes through the openings of the impingement plate impinges upon a surface of the substrate to heat the surface of the substrate.

Aspects of the invention include a controller in communication with the heating element. The controller is configured to control operation of the heating element. In one embodiment, the controller controls operation of the heating element in response to a signal indicative of an operating condition. For example, a received signal may indicate an operating condition comprising an equipment operating mode and/or a temperature measurement.

Another aspect of the invention includes a flow control configured to control a rate of flow of the heated air into the inlet of the heating element. The flow control is in communication with and operates automatically under the control of the controller. The controller conjunctively controls the operation of the heating element and the flow control using a profile that accounts for a combined affect of both the heating element and the flow control. Alternatively or in addition, an embodiment of the controller controls operation of the flow control in response to a signal indicative of an operating condition. A flow meter configured to communicate the signal indicative of the operating condition may communicate a measurement relating to the rate of flow of the heated air. Another exemplary operating condition comprises an equipment operating mode.

Another aspect of the invention may include an additional plenum located underneath the plenum, wherein the additional plenum receives the heated air from the outlet of the heating element and has directs the heated air to the plenum. The impingement plate is replaceable with a replacement impingement plate configured for use with the plenum.

Embodiments of the invention further provide a method of non-contact heating an electronic substrate, comprising heating air using a heating element, and communicating the heated air into a plenum having an inlet for receiving the heated air. The plenum includes an opening for the discharge of the heated air. Processes may communicate the heated air from the plenum through a plurality of openings in an impingement plate mounted over the opening of the plenum. Aspects of the invention support the electronic substrate over the impingement plate, and impinge the heated air upon a surface of the electronic substrate to heat the surface of the substrate.

Another aspect of the invention includes a method of non-contact heating an electronic substrate, comprising directing a flow of heated air towards the electronic substrate, and in response to a determined operating condition, automatically adjusting the flow of the heated air.

Embodiments of the present invention may determine the operating condition from a signal indicative of the determined operating condition. The determined operating condition may include an airflow and/or temperature measurement. In another or the same embodiment, the operating condition may include an equipment operating mode. Exemplary operating conditions include a warm-up state, a cool down state, a standby state coincident with waiting for a product, and a halt production state coincident with pausing production.

In another aspect of the invention, the flow of the heated air may be automatically adjusted using a profile to conjunctively control both heating the air and directing the flow of the heated air, wherein the profile accounts for a combined affect of both heating the air and directing the flow of the heated air.

Embodiments of the invention may ultimately conduct an underfill operation involving the electronic substrate.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE PREFERRED EMBODIMENTS

Embodiments of the present invention include an apparatus and method for the non-contact heating of an electronic substrate using inline heating elements in combination with an automatically controlled airflow. Air heated by the elements is communicated to one or more plenums, which discharge the heated air towards an impingement plate. The impingement plate includes a plurality of openings through which heated air from the plenum passes on its way to heat the electronic substrate. The automatic control of the airflow may be prompted by an operating condition, such as a sensed airflow and/or a transition into an equipment operating mode, e.g., a warm-up, standby, halt production and cool down state. Production may be automatically optimized by using a profile to conjunctively control both the heating of the air and the directing the flow of the heated air. Such a profile accounts for a combined affect of both heating the air and directing the flow of the heated air.

Figure 1:
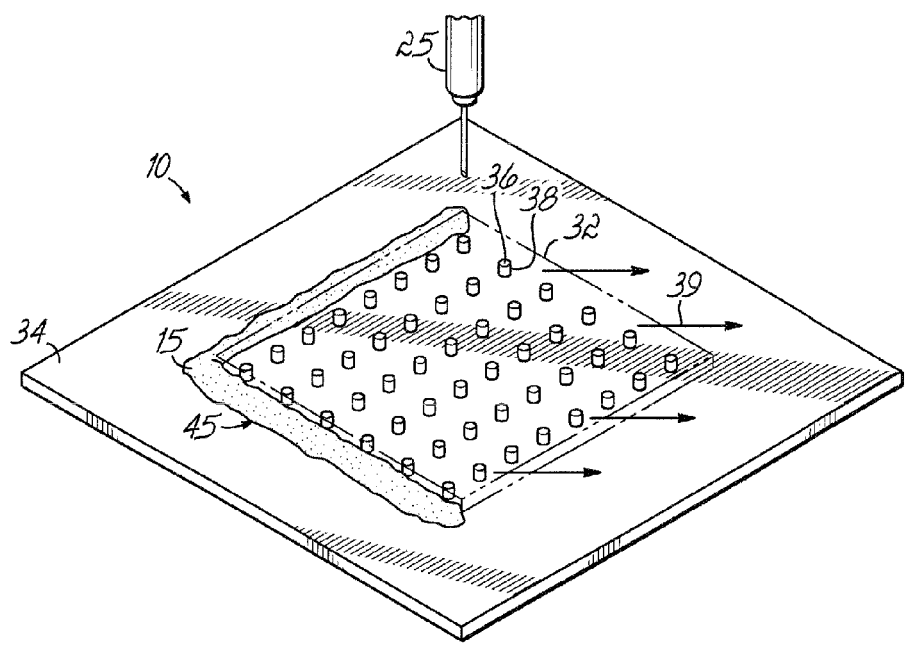
FIG. 1 is a schematic perspective view of a package assembly of a die, shown in phantom, and substrate during an underfilling operation.
Figure 2:
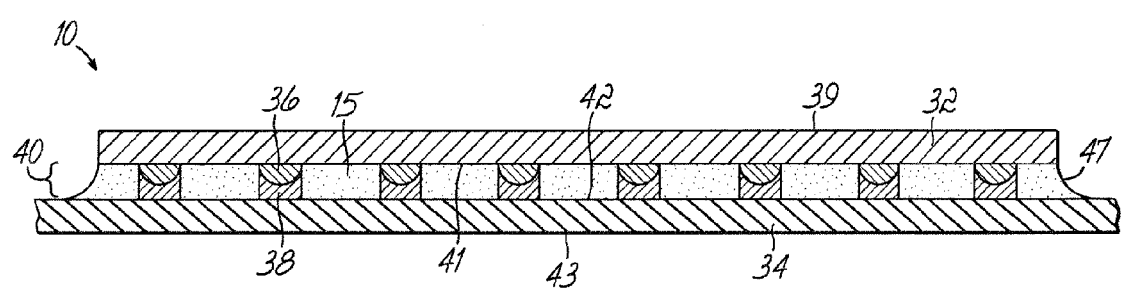
FIG. 2 is a schematic side view of the package assembly of FIG. 1 following an underfilling operation.

With reference to FIGS. 1 and 2, a semiconductor device package 10 in the form of an electronic substrate consists of a die 32 mounted on a package carrier or substrate 34 in a flip chip mounting arrangement. As those skilled in the art will appreciate, substrate 34 may comprise an organic or ceramic substrate material such as a printed circuit board, a flip chip multi-chip module, or a flip chip carrier. The die 32 is electrically and mechanically connected to the substrate 34 through an area array of solder bumps 36 on the underside of the die 32 that are registered or aligned with a corresponding area array of solder pads 38 on the substrate 34. Upon heating, the solder pads 38 on the substrate reflow and physically connect with the solder bumps 36 of die 32 to provide mechanical, thermal and electrical coupling therebetween in the form of solder joints. With this mounting arrangement, a gap 40 is formed between a contact side 41 of the die 32 and a top surface 42 of the substrate 34.

The gap 40 is filled with an encapsulant material 15, such as a liquid epoxy, according to the principles of the present invention. Various different encapsulant materials are suitable for use in the invention, including but not limited to a line of encapsulants commercially available under the HYSOL® tradename from Loctite Corp. (Rocky Hill, Conn.). As illustrated in FIG. 2, encapsulant material 15 is provided from an underfill dispenser 25 as an L-shaped bead 45 dispensed onto the surface of the substrate proximate to the gap 40 and on two contiguous sides of the die 32. Although embodiments of the present invention are described for use with an L-shaped bead, the principles of the invention are applicable to any bead shape, including a single line of encapsulant material 15 disposed along one side edge of die 32, a U-shaped bead of encapsulant material 15 disposed along three side edges of die 32, or other dispensing patterns. The amount of encapsulant material 15 in bead 45 depends upon the desired fillet volume and the under-die volume determined by the size of die 32 and the height tolerances of the solder junctions created between bumps 36 and pads 38.

The underfill dispenser 25 may take any form readily known in the art for dispensing liquid encapsulant or underfill material in a desired pattern relative to the die 32. One suitable underfill dispenser 25 is the DJ-9000 pump commercially available from Nordson Asymtek (Carlsbad, Calif.).

With continued reference to FIGS. 1 and 2, the encapsulant material 15 flows or moves in the gap 40, as indicated generally by arrows 39, under capillary action or with forced assistance. After flow ceases (FIG. 2), the encapsulant material 15 fully encapsulates all of the electrical interconnections provided by the solder joints defined by solder pads 38 and solder bumps 36 and a fillet 47 is formed along the side edges of the die 32. The encapsulant material 15 is cured after the conclusion of the underfilling operation.

Figure 3:
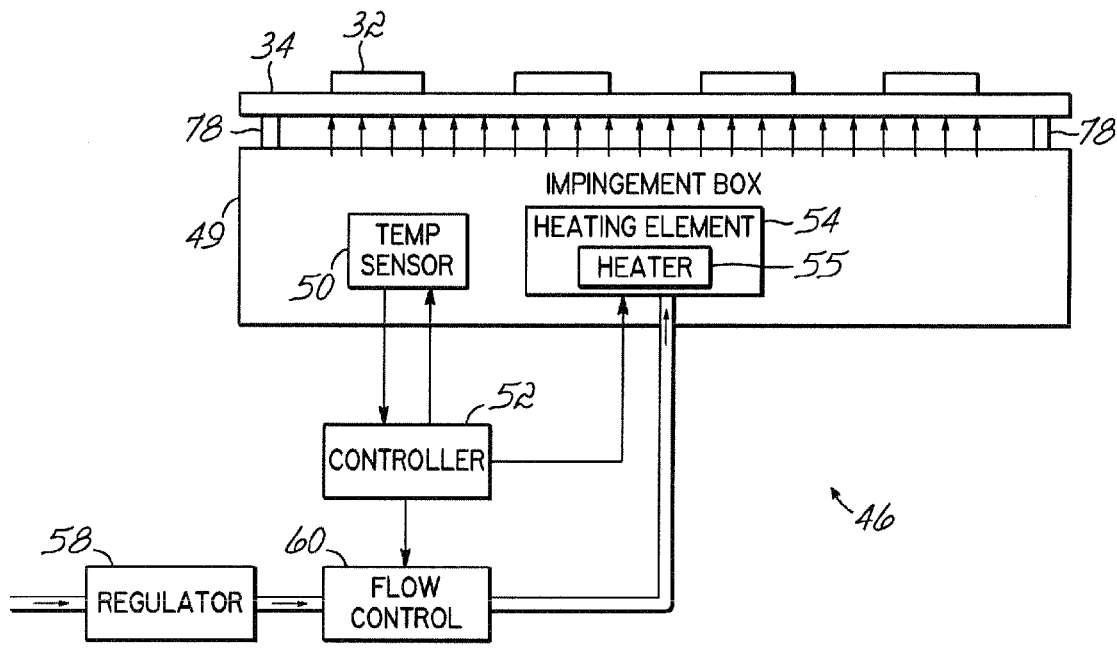
FIG. 3 is a block diagram showing a non-contact heating system configured to heat a substrate in accordance with an embodiment of the present invention.

FIG. 3 is a block diagram showing a non-contact heating system 46 configured to heat a substrate 34 in accordance with an embodiment of the present invention. More particularly, the non-contact heating system 46 includes an impingement box 49 configured to receive, heat and communicate gas to the substrate 34. The substrate is supported above the impingement box 49 by rails 78.

As shown in FIG. 3, a temperature sensor 50, e.g., a thermocouple or resistance temperature detector (RTD), is configured to generate a signal indicative of the temperature within the impingement box 49. A controller 52 may be wired or wirelessly connected to receive the signal from the temperature sensor 50. The controller 52 uses the sensed temperature to generate signals, which are used to control operation of a heating element 54. For purposes of this specification, a heating element generally comprises an inlet for unheated air, a heater 55 for heating the air and an outlet for the heated air. Suitable such heating elements, e.g., inline heaters, are commercially available from Farnam, Inc. (Arden, N.C.), Omega Engineering, Inc. (Stamford, Conn.) and Watlow Electric Manufacturing Co. (St. Louis, Mo.).

The controller 52 may use known proportional-integrative-derivative (PID), empirical data/algorithms and/or fuzzy logic, among other mechanisms described below to automatically control the heating element 54 and to achieve a temperature or a temperate range specified by the operator. While an embodiment of the controller 52 may comprise simply a processor having access to a memory, other embodiments may include a computer system, to include networked computers, memory and other resources. As described herein, the automated control of the heating element 54 may account for airflow considerations. For example, a profile used to the control the heating element 54 may take into account, among other conditions, the current airflow from the flow control device 60 as it concurrently impacts the temperature of the non-contact heating system 46.

To this end, the controller 52 of the embodiment of FIG. 3 concurrently controls the operation of a flow control device 60. In response to signals from the controller 52, the flow control device 60 controls the flow of air from a regulator 58 through a hose to the heating element 54. As with operation of the heating element 54, the controller 52 may operate the flow control device 60 according to profiles recalled from memory and configured to optimize the heating process. Such profiles may be determined automatically in response to a determined operating condition. Exemplary operating conditions may include a detected temperature or an equipment operating mode. For instance, the controller 52 may determine that the non-contact heating system 46 has entered a standby state, i.e., awaiting product. In response to entering the state, the controller 52 may use a lookup table to determine a power level/airflow setting or sequence of settings for the flow control device 60.

Figure 4:
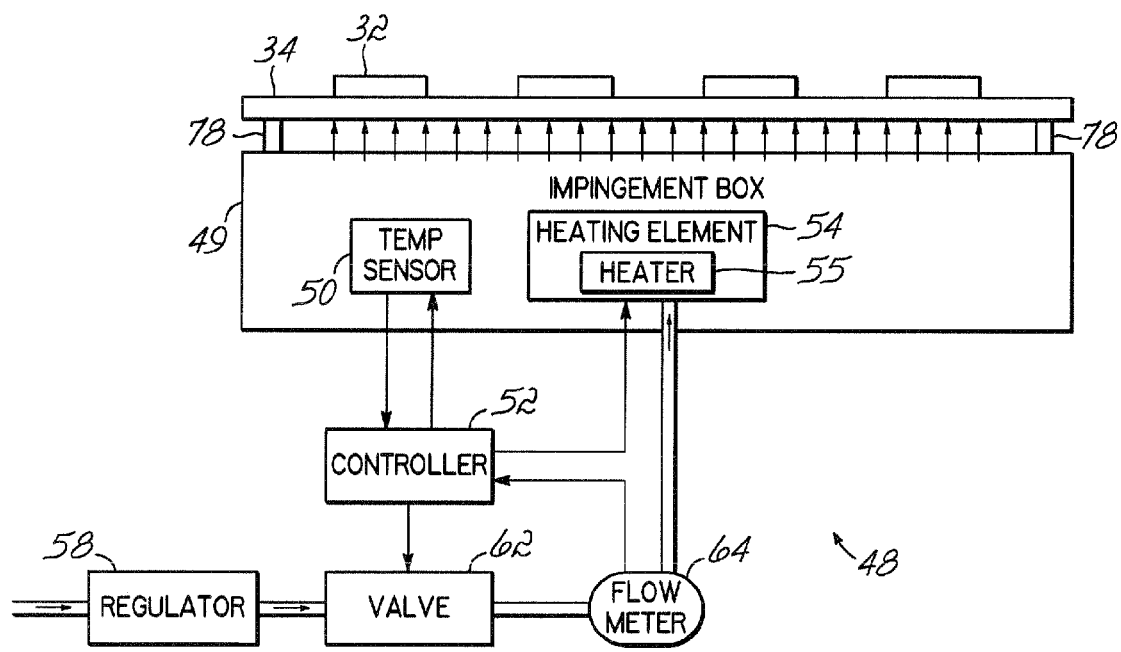
FIG. 4 is a block diagram showing a second non-contact heating system incorporating an airflow feedback mechanism and configured to heat a substrate in accordance with the principles of the present invention.

FIG. 4 is a block diagram showing a second non-contact heating system 48 configured to heat a surface of a substrate 34 in accordance with an embodiment of the present invention. The non-contact heating system 48 differs from the non-contact heating system 46 of FIG. 3 primarily in that it incorporates an airflow feedback mechanism.

Turning more particularly to FIG. 4, the non-contact heating system 48 includes an impingement box 49 configured to receive and otherwise communicate heated gas to the substrate 34. Temperature sensor 50 of the impingement box 49 generates signals indicative of the temperature within the impingement box 49. One or more such sensors 50 may be positioned at any location within the impingement box 49 where a temperature measurement is needed. As above, a controller 52 receives the signals from the temperature sensor 50. The controller 52 may use the sensed temperature to generate signals controlling operation of the heating element 54.

The controller 52 of the embodiment of FIG. 4 concurrently controls the airflow to the heating element 54 using an air control valve 62. Airflow directed via a hose or other conduit from the flow control/air control valve 62 to the heating element 54 is measured by a flow meter 64. A signal generated by the flow meter 64 and indicative of the measured airflow is communicated to the controller 52. The controller 52 may then use the realtime or near-realtime airflow measurements to optimize substrate heating conditions. That is, the controller 52 may use the airflow/pressure measurement to automatically affect control of the air control valve 62 and/or operation of the heating element 54.

Figure 5:
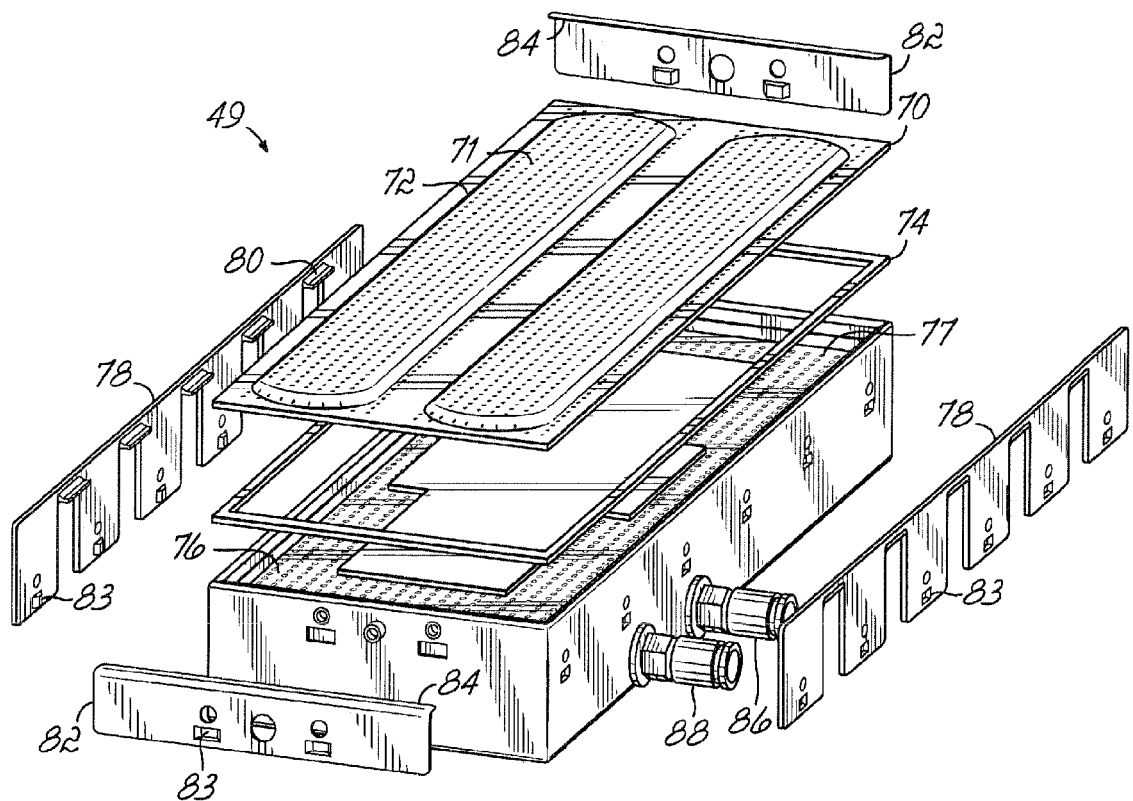
FIG. 5 is an exploded view of an impingement box shown in the system of FIG. 3.

FIG. 5 is an exploded, perspective view of an impingement box 49 that includes select components of the system of FIG. 3. More specifically, the impingement box 49 includes an impingement plate 70. The impingement plate 70 includes openings 71 for communicating heated air from the plenum 76. Air passing through the impingement plate 70 is diffused as it is directed to the substrate 34 (FIG. 3) positioned above or otherwise in thermal communication with the impingement plate 70.

The size and spacing of the laser machined or drilled openings 71, as well as the dimensions of any embossing/contours 72 of the impingement plate 70, may be readily customized for a specific application. Such customization is facilitated by replaceable and relatively lightweight construction of the impingement plate 70. The impingement plate 70 may be constructed from a relatively thin metal. As such, the impingement plate 70 may be easily drilled or laser machined prior to an application. Openings 71 may be made smaller than was conventionally possible, e.g., 0.02" diameter with 5 mm spacing, and may be converging, angled or straight.

Similarly, because there is no need for electrical connections wired to conventional blocks, there are no electrical obstacles complicating the removal and replacement of the plate 70. As such, unique, customized impingement plates 70 may be used in instances where different aperture configurations would be beneficial, or where an impingement plate 70 has been damaged or gummed up with adhesive.

To facilitate such ease of replacement, side and end rails 78, 82 removably secure the impingement plate 70 with tabs 80, 84 and fasteners 83. The rails 78 additionally provide a support upon which the substrate 34 (FIG. 3) rests.

The impingement plate 70 is positioned on a silicone gasket 74 to seal off the plenum 76, which opens up and communicates heated air to the impingement plate 70. Air enters the plenum 76 through inlet 88, which is located adjacent a safety air pressure switch outlet 86 of the impingement box 49. The switch outlet prevents activation of the heating element 54 in the absence of adequate pressure/flow within the impingement box 49.

Figure 6:
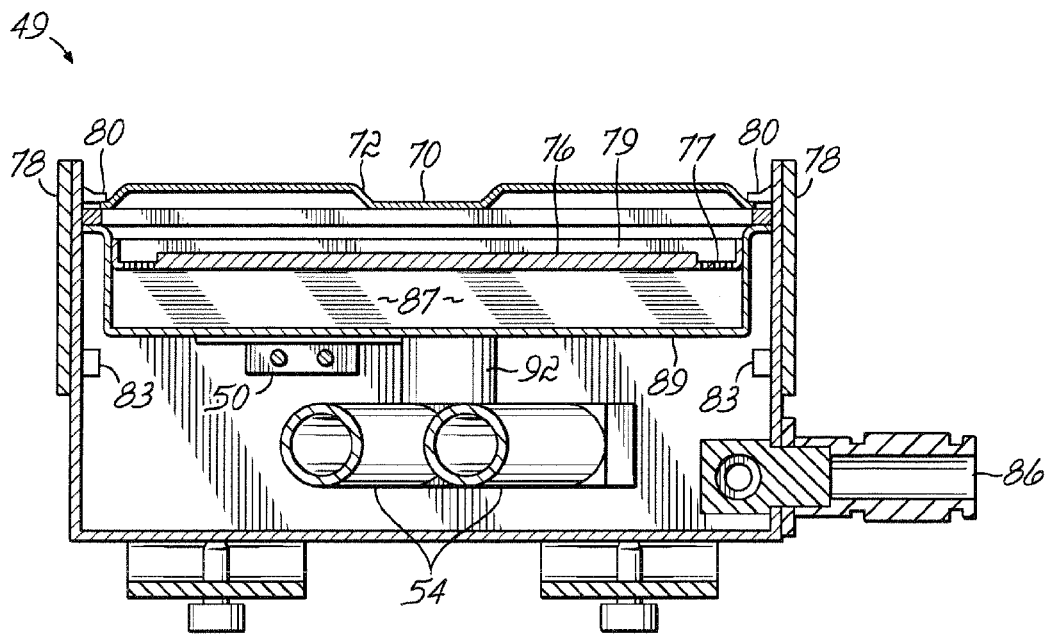
FIG. 6 is a cross-sectional view of the impingement box shown in FIG. 5.

Embodiments of the impingement box 49 may include multiple plenums. For instance, a bottom layer/plate 79 of the plenum 76 may comprise a top layer of an additional plenum located underneath plenum 76. This feature is best understood with reference also to FIG. 6, which shows a cross-sectional view of the impingement box 49 of FIG. 5. As shown in FIG. 6, plates 70 and 79 form the vertical boundaries of plenum 76. The corresponding boundaries of another plenum 87 are generally defined by plate 79 and plate 89.

Plate 79 of the plenums 76 and 87 includes openings 77 (FIG. 5) that assist in further diffusing and mixing the hot air directed from the heating elements 54. That is, the heated air achieves greater temperature uniformity as it mixes while flowing from the heating elements 54 into plenum 87, through the openings 77 of plate 79 into the plenum 76, and then through openings 71 of the impingement plate 70 to the substrate 34 (FIG. 3). Plate 79 thus initially blocks and redirects hot air coming from the heater outlet 92 of the heating element 54. Prior to coming in contact with the substrate 34 (FIG. 3), the air must diffuse through openings 77 and become more temperature homogenous with air presently mixing within the plenum 76 and openings 71.

Figure 7:
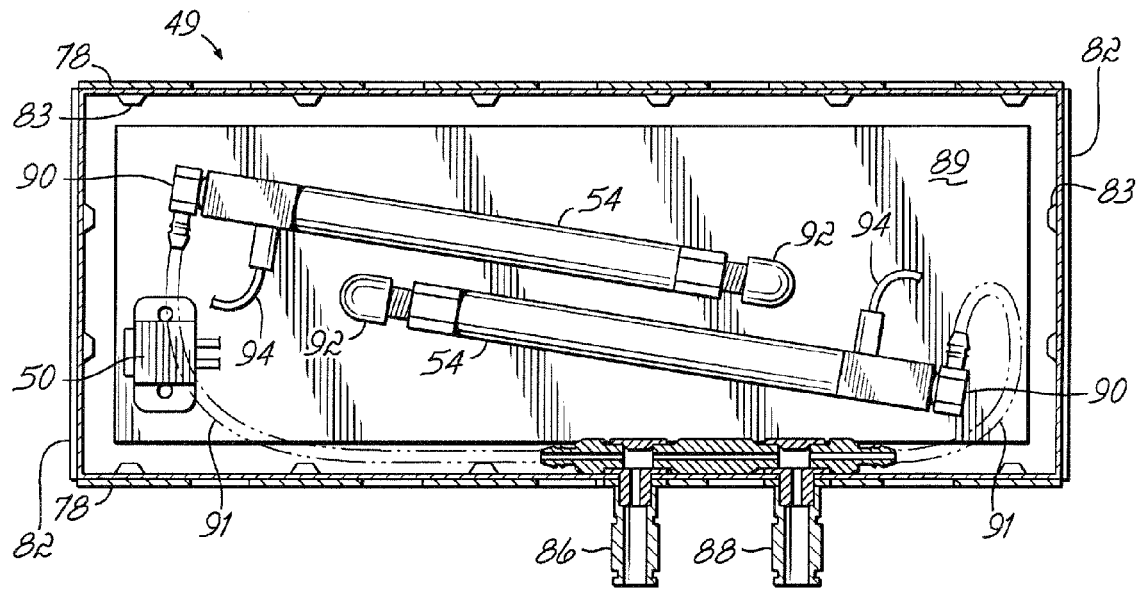
FIG. 7 is a view of the bottom of impingement box shown in FIGS. 5 and 6.

FIG. 7 is a bottom view of the impingement box 49 shown in FIGS. 5 and 6. More particularly, FIG. 7 shows air inlets 90 of the heating elements 54. The inlets 90 receive air at ambient temperature from hoses 91 connected to the air inlet 88 of the impingement box 49. The air heated by the heating elements 54 is directed through heater outlets 92, through plate 89, and into plenum 87 (FIG. 6). Power and communications to and with the heating elements 54 is accomplished via wires 94.

Figure 8:
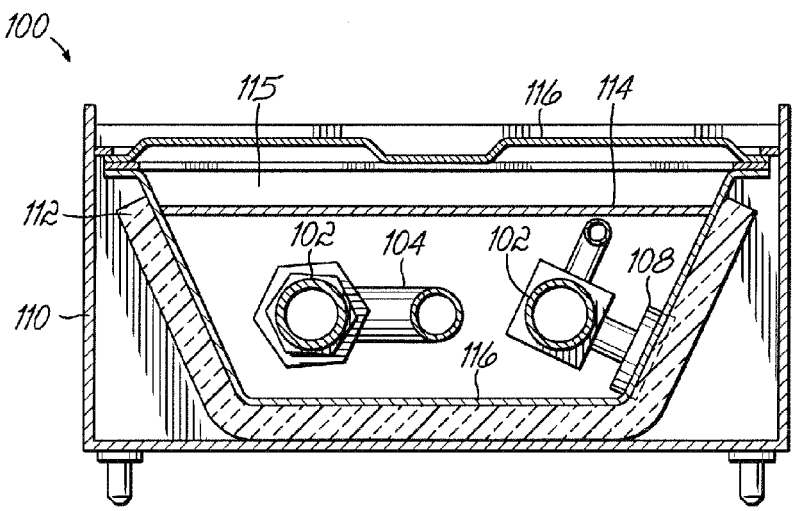
FIG. 8 is a cross-sectional, end view of an impingement box in accordance with an alternative embodiment of the present invention.

FIG. 8 is a cross-sectional, end view of an impingement box 100 of another embodiment for heating a substrate in accordance with an embodiment of the present invention. As shown in FIG. 8, the impingement box 100 includes heating elements 102 secured to an inner frame 116 by brackets 108. The heating elements 102 are configured to receive ambient air from inlets 106.

Figure 9:
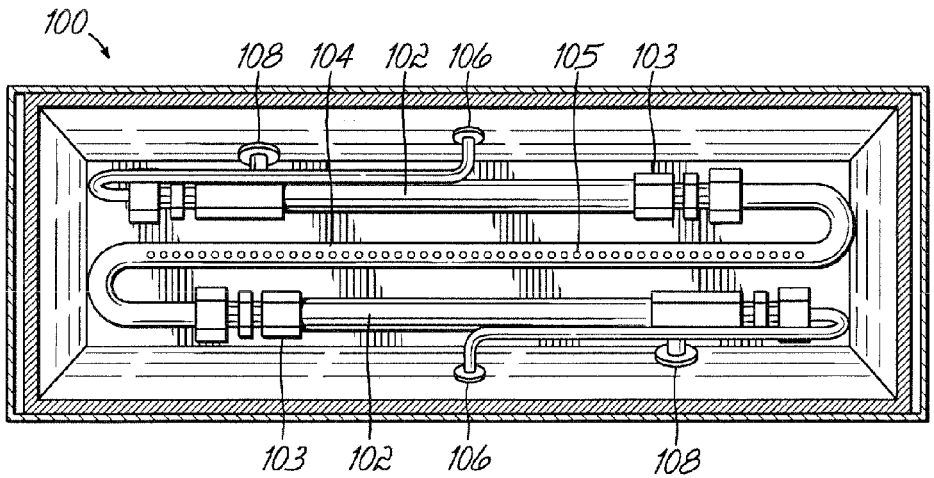
FIG. 9 is a cross-sectional view of one side of the impingement box shown in FIG. 8.

Heating elements 102 are combined at their respective outputs 103 to a common segment 104. The segment 104 comprises a conduit having a plurality of openings 105. In one respect, the segment comprises another plenum in that it includes a partially contained area that receives heated air that diffuses through an opening. More particularly, air heated by the heating elements 102 is mixed within the common segment 104 and diffuses from the openings 105 towards a diffusion plate 114, as shown in FIG. 9. FIG. 9 is a cross-sectional view of one side of the impingement box 100 shown in FIG. 8. The heated air is further diffused and mixed as it travels through the diffusion plate 114 into a plenum 115. Greater temperature uniformity is achieved as the air mixes in the plenum 115 and travels through impingement plate 116 to substrate 34 (FIG. 3).

With continued reference to FIG. 9, the impingement box 100 includes an inner frame 116 that is separated from an outer frame 110 by an insulating layer 112. In the embodiment shown in FIG. 9, there is no physical contact between the outer and inner frames 110, 116. Among other advantages, this feature keeps the outer frame 116 relatively cooler for operator handling considerations.

Figure 10:
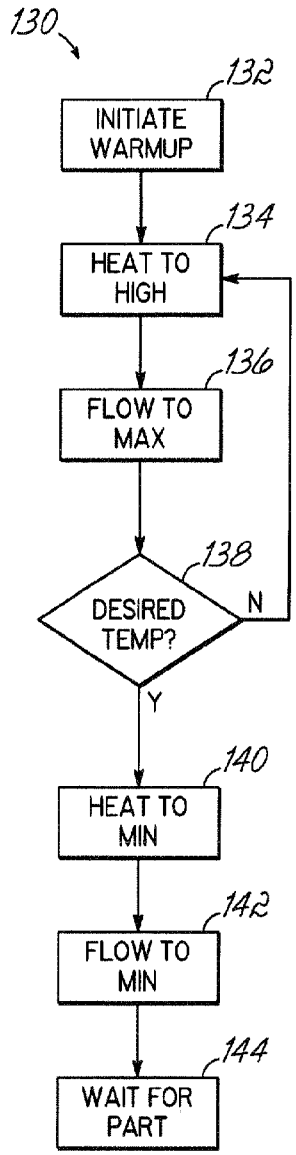
FIG. 10 is flowchart having steps executable by the controller of FIG. 3 for optimizing heating and airflow operations warm-up and standby modes of equipment operation in accordance with an embodiment of the present invention.

FIG. 10 is flowchart 130 having steps executable by the controller 52 of FIG. 3 for optimizing system performance when operating in warm-up and standby equipment modes, or states. Warm-up mode generally regards an equipment state where the system ramps up heat within the impingement box 49 to achieve an initial, desired operating temperature. As with other operating modes, operation of the heating element 54 and flow control 60, 62 in the embodiment of FIG. 10 are optimized individually and collectively to efficiently achieve the desired operating condition.

Turning more particularly to the flowchart 130, the controller 52 may receive at block 132 an instruction to enter warm-up mode. The instruction may be in response to an operator activating the system. In response, the controller 52 may recall initial operating parameters, include the desired, initial temperature associated with a standby mode. This desired, standby temperature is typically predetermined using empirical data.

At block 134, the controller 52 instructs the heating element 54 to generate heat at its highest setting, and sets at block 136 the flow control 60, 62 to its maximum setting. As such, the non-contact heating system 46 succeeds in generating and communicating to the impingement box 49 the maximum heat energy at the maximum rate.

Once the desired, standby temperature is detected at block 138 by the temperature sensor 50, then the non-contact heating system 46 may enter standby mode. While operating in this mode, the heat and airflow are reduced at blocks 140 and 142, respectively, while awaiting product. The heat and airflow may be reduced to levels that conserve energy, but nonetheless maintain the desired temperature, or temperature range. These minimum heat and airflow levels additionally maintain operating conditions with respect to each of the heating element 54 and flow control 60, 62 that permit efficient and speedy ramping, e.g., minimizing delay in achieving a temperature required for an arriving part.

As discussed herein, the respective heater and airflow settings may further be optimized to account for potential synergies. For instance, increased airflow may function to reduce the heating requirement of the heating element 54 to achieve or maintain the desired, standby temperature as the non-contact heating system 46 awaits the substrate 34 or other part at block 144. In this manner, the conjunctive control of both settings may realize additional efficiencies and economies.

Just as the controller 52 adjusts either or both the heater and airflow settings in response to signals indicating an operating mode change, the controller 52 may concurrently respond to signals indicating actual temperature readings. For example, the controller 52 may receive a signal from the temperature sensor 50 while operating in standby mode. The signal may indicate that the actual temperature has fallen outside of a desired range associated with the standby mode. In response, the controller 52 may adjust the control of either or both the heating element 54 and flow control 60, 62. The controller 52 may thus account for the combined affects of each of the heating element 54 and flow control 60, 62 when determining an optimized control profile that conjunctively controls (both) the heating element 54 and flow control 60, 62.

This optimization may be accomplished in one embodiment using empirical data. For instance, the controller 52 may use an empirical formula to achieve and optimize a thermal profile. A lookup table used by the controller 52 may include sensed temperature settings that are matched against the temperature readings continuously communicated by temperature sensor 50. Programmatic links within the lookup table may indicate an optimized control algorithm, or profile, for the sensed temperature condition, as well as for conditions relating to the operating mode and utilized equipment. The controller 52 of another or the same embodiment may use fuzzy logic/artificial intelligence and/or known PID techniques. In any case, the controller 52 may apply the control parameters and/or sequencing of the determined control profile to either or both the heating element 54 and flow control 60, 62.

Figure 11:
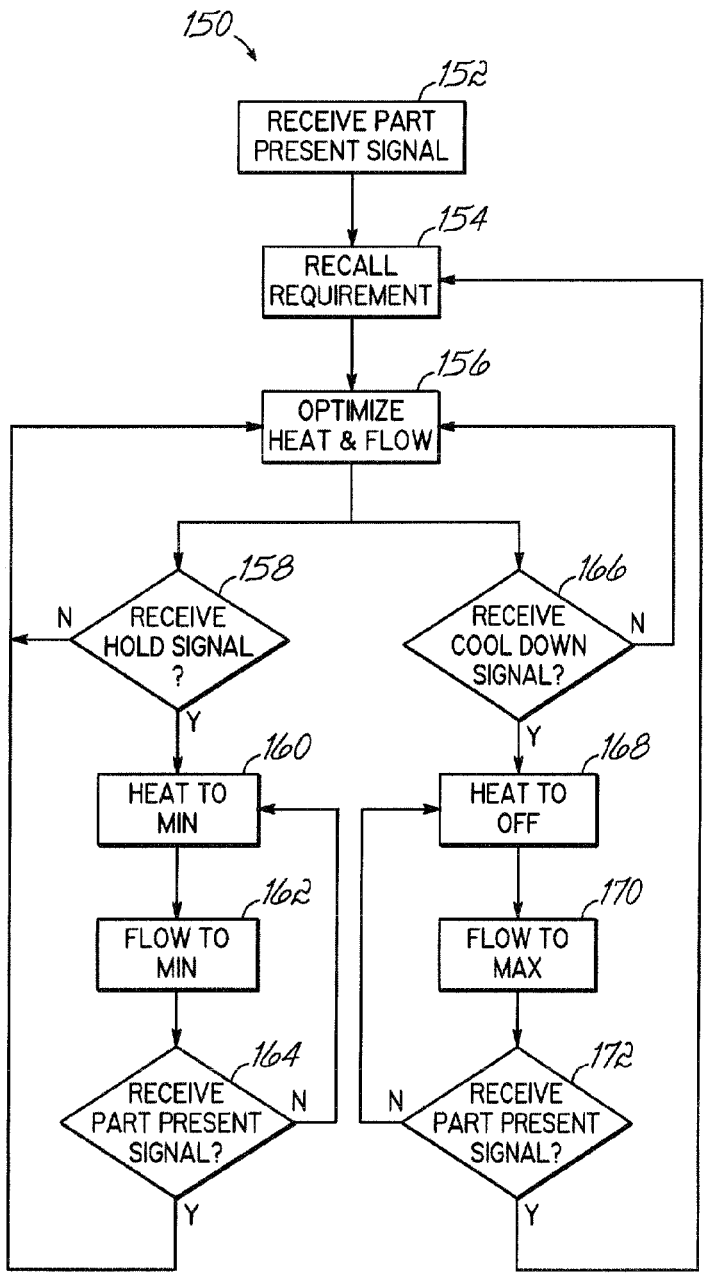
FIG. 11 is flowchart having steps executable by the controller of FIG. 3 for optimizing heating and airflow operations during cool down and halt production modes of operation in accordance with an embodiment of the present invention.

FIG. 11 is flowchart 150 having steps executable by the controller 52 of FIG. 3 for optimizing heating and airflow operations during cool down and halt production modes of operation in accordance with an embodiment of the present invention. At block 152, the non-contact heating system 46 receives a part while waiting in standby mode. In response to receiving a signal indicative of the part's arrival, the controller 52 may recall at block 154 from memory customer requirements associated with the part/substrate 34. A typical customer requirement will include a temperature setting to facilitate underfilling.

The controller 52 at block 156 optimizes operation of the heating element 54 and flow control 60, 62 to achieve the desired, customer requirement. As discussed herein, such optimization may account for the combined affects and interactions of each of the heating element 54 and flow control 60, 62. This optimization may be accomplished in one embodiment using empirical data, i.e., using an empirical formula to determine an optimal thermal control profile. Another or the same implementation may utilize a lookup table or other memory resource, as well as PID and/or other processes to determine the optimized control profile. The determined profile may be applied to either or both the heating element 54 and the flow control 60, 62. Embodiments may further utilize fuzzy logic/artificial intelligence and/or known PID techniques, as well as relatively simple fixed values. While and after the temperature is optimized at block 156, the controller 52 may react and control either or both the heating element 54 and flow control 60, 62 in response to continuously fed back temperature data.

During operation, the controller 52 may receive at block 158 a signal indicating that the underfilling production should be halted. In conventional systems, circuit boards in the proximity of the impingement plate 70 can be prematurely cured due to prolonged exposure to heat while production is paused. Embodiments of the present invention address this problem of the prior art by reducing at blocks 160 and 162, respectively, the heat and airflow arriving at the die 32 and substrate 34. The heat and airflow may be reduced to levels that conserve energy, but that nonetheless maintain operation with respect to each of the heating element 54 and flow control 60, 62 to permit efficient and rapid ramping back to the optimized settings at blocks 164 and 156.

At the conclusion of an underfilling operation at block 166 of FIG. 11, the controller 52 may receive a cool down signal. A conventional impingement block may require cooling for more than an hour before it can be handled and replaced without gloves. The embodiment of FIG. 11 addresses this inefficiency by optimizing the airflow and heating operations to more rapidly cool the impingement box 49. More specifically, the controller 52 adjusts at block 170 the airflow to its maximum level, and shuts off the heating element 54 at block 168. The non-contact heating system 46 may then remain shut off, or prepare for another underfilling operation at block 172.

In general, the routines executed by the controller 52 to implement the embodiments of the invention, whether implemented as part of an operating system or a specific application, component, program, engine, process, programmatic tool, object, module or sequence of instructions, or even a subset thereof, may be referred to herein as "computer program code," or simply "program code." Program code typically comprises one or more instructions that are resident at various times in various memory and storage devices in the controller 52, and that, when read and executed by one or more processors in the controller 52, cause that controller 52 to perform the steps necessary to execute steps or elements embodying the various aspects of the invention. One of skill in the art should appreciate that embodiments consistent with the principles of the present invention may nonetheless use program code resident at only one, or any number of locations.

Moreover, while the invention has and hereinafter will be described in the context of fully functioning controller and control systems, those skilled in the art will appreciate that the various embodiments of the invention are capable of being distributed as a program product in a variety of forms, and that the invention applies equally regardless of the particular type of computer readable, signal bearing media used to actually carry out the distribution. Examples of signal bearing, controller readable media include, but are not limited to tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In practice, embodiments of the present invention provide a mass flow control system that allows for the flow control of impingement gasses based on digital and analog inputs. This control enables optimization of the warm-up, process heat, and cool down processes while minimizing the compressed air, electrical power consumption, and thermal energy dispersed into the customer's environment.

Cold, pressurized air, or house air, is supplied to the non-contact heating system 46. The air mass flow rate is regulated immediately upstream of the inlet to the impingement box 49. The non-contact heating system 46 heats the air convectively, as it flows through the heating element 54. The heater element 54 is controlled by controller 52. The controller 52 receives input from temperature sensor 50, e.g., a thermocouple or RTD, which operates as a sensor/feedback device. A set point of the heating element 54 may be determined by the operator based on the desired substrate temperature.

Aspects of the invention allow the operator to control the rate at which the substrate is heated to the target temperature, and then to control the substrate temperature as precisely as possible, while consuming the least amount of pressurized air and electrical power. With conventional systems, the volumetric flow rate is set before the process begins, and is accomplished with a manual valve. During conventional processing, this valve is not adjusted. Features of the embodiments of the present invention replace the manual regulated valve with an electronically controlled valve. This valve will provide control over the flow rate utilizing feedback regarding an operating condition. Examples of operating conditions may include an actual measurement of airflow of the impingement gas, pressure of the impingement gas upstream and downstream of the flow control valve, the temperature of the impingement gas, the substrate, and/or the impingement box, as well as a machine operating mode (e.g., machine warm-up, substrate in place, machine waiting, machine standby, machine cooling, etc.).

During initial system warm-up, airflow may be automatically maximized, with heater on full power, to optimize flow and achieve the steepest slope (and shortest warm up time) to process temperature. Flow can also be controlled to minimize over or under dampening.

When the system is in a wait, or standby state, flow can be optimized to maintain the system at the set point using the least amount of air (e.g., the heater duty cycle can be allowed to get near one hundred percent, while dropping airflow as low as possible). This minimizes both air consumption and thermal pollution inside the machine while keeping the heater block ready for the next substrate to arrive.

When a substrate is in position, the airflow can be controlled to precisely ramp the part to process temperature and then control the profile of the temperature at a desired shape.

When an operator desires to change out one impingement box for another (each substrate requires a custom impingement box) the heating element 54 may be turned off, and flow can be maximized to cool down the impingement box as rapidly as possible. This reduces the wait time before a tooling change out.

The heating element 54 heats the air before it is communicated via an outlet into a plenum. The air flows from plenum 76 up through openings 71 in a thin metal impingement plate 70 for impingement onto the electronic substrate 34 supported above the plate 70. The heating element 54 heats the air convectively as it flows through the heater. The set point temperature for the heating element 54 is determined by the customer based on the desired substrate temperature. The heating element 54 of the systems 46, 48 provides advantages in that it eliminates the need for the heavy aluminum block construction of the prior art.

Moreover, the impingement plate 70 is thin compared to a conventional aluminum block, and is relatively easy to machine holes into as compared to the prior art aluminum block. Because the impingement plate 70 is so easy to machine, it is possible to machine specific hole patterns into the plate 70 to optimize the heating of a given substrate. In the preferred embodiment, the plate 70 can be laser machined at a very low cost. The machined openings can be much smaller than was possible with the prior system and the profile of the openings can be customized for shape and taper as needed.

As such, the cost of embodiments of the invention is lower than the conventional costs. The use of the heating element 54 permits the heater to be sized in wattage and voltage according to a customer's requirements, further improving the energy efficiency of the system while reducing its cost. The low thermal mass of the impingement plate 70 enables the system to warm-up and cool down much more quickly than in the prior art.

Because the plenum 76 and impingement plate 70 are separated from the heating source, it is possible to switch out an impingement box 49 for a different sized or shaped box to optimize the heating of the customer's substrate 34. This was difficult to do with the prior art designs where the heating elements were incorporated into the aluminum block.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. For instance, while embodiments of the invention may have particular application in the context of underfilling operations, other aspects of the invention are applicable to substrate heating that involves mechanical strengthening, such as is used to apply adhesives to cellular telephone boards. The invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. An apparatus for non-contact heating of a surface of an electronic substrate, comprising:
    a heating element having an inlet for receiving unheated air, a heater adapted to heat the unheated air to form heated air, and an outlet for the heated air;
    a plenum having an inlet for receiving the heated air from said outlet of said heating element, said plenum having an opening for the discharge of the heated air;
    an impingement plate between said opening of said plenum and the electronic substrate, said impingement plate having a plurality of openings through which the heated air from said plenum passes; and
    a support for the electronic substrate, said support positioning the electronic substrate relative to said openings in said impingement plate so that the heated air impinges the substrate.

2. The apparatus of claim 1, further comprising:
    a controller in communication with said heating element and configured to control operation of said heating element.

3. The apparatus of claim 2, wherein said controller controls operation of said heating element in response to a signal indicative of an operating condition.

4. The apparatus of claim 3, wherein said operating condition comprises an equipment operating mode.

5. The apparatus of claim 3, further comprising:
    a temperature sensor configured to communicate said signal indicative of said operating condition, wherein said operating condition comprises a temperature measurement.

6. The apparatus of claim 2, further comprising:
    a flow control configured to control a rate of flow of the heated air into said inlet of said heating element, wherein the flow control is in communication with and operates automatically under the control of the controller.

7. The apparatus of claim 6, wherein said controller conjunctively controls said operation of said heating element and said flow control using a profile that accounts for a combined effect of both said heating element and said flow control.

8. The apparatus of claim 6, wherein said controller controls operation of said flow control in response to a signal indicative of an operating condition.

9. The apparatus of claim 8, further comprising:
a flow meter configured to communicate said signal indicative of said operating condition, wherein said operating condition comprises a measurement relating to said rate of flow of the heated air.

10. The apparatus of claim 8, wherein said operating condition comprises an equipment operating mode.

11. The apparatus of claim 1, further comprising:
an additional plenum located underneath said plenum, wherein said additional plenum receives the heated air from said outlet of said heating element and directs the heated air to the plenum.

12. The apparatus of claim 1, wherein said impingement plate is replaceable with a replacement impingement plate configured for use with said plenum.

13. An apparatus for non-contact heating of a surface of an electronic substrate, comprising:
a heating element having an inlet for receiving unheated air, a heater adapted to heat the unheated air to form heated air, and an outlet for the heated air;
a controller in communication with said heating element and configured to control operation of said heating element;
a plenum having an inlet for receiving the heated air from said outlet of said heating element, said plenum having an opening for the discharge of the heated air;
a flow control configured to control a rate of flow of the heated air into said inlet of said heating element, wherein the flow control is in communication with and operates automatically under the control of the controller;
an impingement plate between said opening of said plenum and the electronic substrate, said impingement plate having a plurality of openings through which the heated air from said plenum passes; and
a support for the electronic substrate, said support positioning the electronic substrate relative to said openings in said impingement plate so that the heated air impinges the substrate.

14. The apparatus of claim 13, wherein said controller controls operation of said heating element in response to a signal indicative of an operating condition.

15. The apparatus of claim 14, wherein said operating condition comprises an equipment operating mode.

16. The apparatus of claim 14, further comprising:
a temperature sensor configured to communicate said signal indicative of said operating condition, wherein said operating condition comprises a temperature measurement.

17. The apparatus of claim 13, wherein said controller conjunctively controls said operation of said heating element and said flow control using a profile that accounts for a combined effect of both said heating element and said flow control.

18. The apparatus of claim 13, wherein said controller controls operation of said flow control in response to a signal indicative of an operating condition.

19. The apparatus of claim 18, further comprising:
a flow meter configured to communicate said signal indicative of said operating condition, wherein said operating condition comprises a measurement relating to said rate of flow of the heated air.

20. The apparatus of claim 18, wherein said operating condition comprises an equipment operating mode.

21. An apparatus for non-contact heating of a surface of an electronic substrate, comprising:
a heating element having an inlet for receiving unheated air, a heater adapted to heat the unheated air to form heated air, and an outlet for the heated air;
a plenum having an inlet for receiving the heated air from said outlet of said heating element, said plenum having an opening for the discharge of the heated air;
an impingement plate between said opening of said plenum and the electronic substrate, said impingement plate having a plurality of openings through which the heated air from said plenum passes; and
a support for the electronic substrate, said support positioning the electronic substrate relative to said openings in said impingement plate so that the heated air impinges the substrate,
wherein said impingement plate is replaceable with a replacement impingement plate configured for use with said plenum.

* * * * *